US006121718A

United States Patent [19]
Mohr, III

[11] Patent Number: 6,121,718
[45] Date of Patent: Sep. 19, 2000

[54] MULTILAYER TRANSDUCER ASSEMBLY AND THE METHOD FOR THE MANUFACTURE THEREOF

[75] Inventor: John Paul Mohr, III, San Jose, Calif.

[73] Assignee: Acuson Corporation, Mountain View, Calif.

[21] Appl. No.: 09/052,776

[22] Filed: Mar. 31, 1998

[51] Int. Cl.[7] .................................................. H01L 41/08
[52] U.S. Cl. .......................................... 310/334; 310/366
[58] Field of Search ........................... 310/328, 334–337, 310/366

[56] References Cited

U.S. PATENT DOCUMENTS

| | | | |
|---|---|---|---|
| 3,281,613 | 10/1966 | Hatschek | 310/366 X |
| 3,390,287 | 6/1968 | Sonderegger | 310/366 X |
| 4,217,684 | 8/1980 | Brisken et al. | |
| 4,845,399 | 7/1989 | Yasuda et al. | |
| 5,115,809 | 5/1992 | Saitoh et al. | |
| 5,163,436 | 11/1992 | Saitoh et al. | |
| 5,381,385 | 1/1995 | Greenstein | |
| 5,406,164 | 4/1995 | Okawa et al. | |
| 5,410,205 | 4/1995 | Gururaja | |
| 5,459,371 | 10/1995 | Okawa et al. | |
| 5,534,092 | 7/1996 | Ogawa et al. | |
| 5,548,564 | 8/1996 | Smith | |
| 5,549,778 | 8/1996 | Yokoyama et al. | |
| 5,597,494 | 1/1997 | Kohno et al. | |
| 5,598,051 | 1/1997 | Frey | |
| 5,603,147 | 2/1997 | Bischoff et al. | |
| 5,724,976 | 3/1998 | Mine et al. | |

OTHER PUBLICATIONS

"A Dual Frequency Ultrasonic Probe," S. Saitoh et al., Research and Development Center, Toshiba Corporation, Kawasaki, Kanagawa 210, pp. 172–174, (1991).
"Special Issue Correspondence," M. Greenstein et al., IEEE Translations on Ultrasonics Ferroelectrics and Frequency Control, vol. 43, No. 4, pp. 620–622, (1996).
"Multi–Layer PZT Transducer Arrays for Improved Sensitivity," R. Goldberg, et al., Ultrasonics Symposium, pp. 551–554, (1992).
"A Low–Impedance Ultrasonic Probe Using a Multilayer Piezoelectric Ceramic," S. Saitoh, et al., Japanese Journal of Applied Physics, vol. 28 Supplement 28–I, pp. 54–56, (1989).
"Multilayer Thin Film Piezoelectric Transducers," J. De Klerk, IEEE Transactions on Sonics and Ultrasonics, vol. SU–13, No. 3, pp. 99–103, (1966).
"Transmission Parameters of Thickness–Driven Piezoelectric Transducers Arranged in Multilayer Configurations," E. Sittig, IEEE Transactions on Sonics and Ultrasonics, vol. SU–14, No. 4, pp. 167–174, (1967).
"Multilayer Piezoelectric Ceramics for Two–Dimensional Array Transducers," R. Goldberg, IEEE Transactions, Ferroelectrics, and Frequency Control, vol. 41, No. 5, pp. 761–771, (1994).
"Optimization of Signal–to Noise Ratio for Multilayer PZT Transducers," R. Goldberg, Ultrasonic Imaging 17, pp. 95–113, (1995).
"A. Dual Frequency Ultrasonic Probe for Medical Applications," S. Saitoh, et al., IEEE Translations on Ultrasonics, Ferroelectrics, and Frequency Control, vol. 42, No. 2, pp. 294–300, (1995).
"Multi–Layer Piezoelectric Ceramics for Medical Ultrasound Transducers," R. Goldberg, UMI Dissertation Services, 1994.

*Primary Examiner*—Mark O. Budd
*Attorney, Agent, or Firm*—Brinks Hofer Gilson & Lione

[57] ABSTRACT

A multilayered transducer assembly and the method of fabricating a multilayered transducer assembly using commercially available sheets of piezoelectric material and depositing electrodes thereon. The top and bottom surfaces of each layer have a major and a minor electrode formed thereon. The layers are stacked together so that the minority electrode formed on one layer is in contact with a minority layer formed on an adjacent layer and a majority layer formed on a surface is in contact with a majority electrode formed on an adjacent layer.

6 Claims, 3 Drawing Sheets

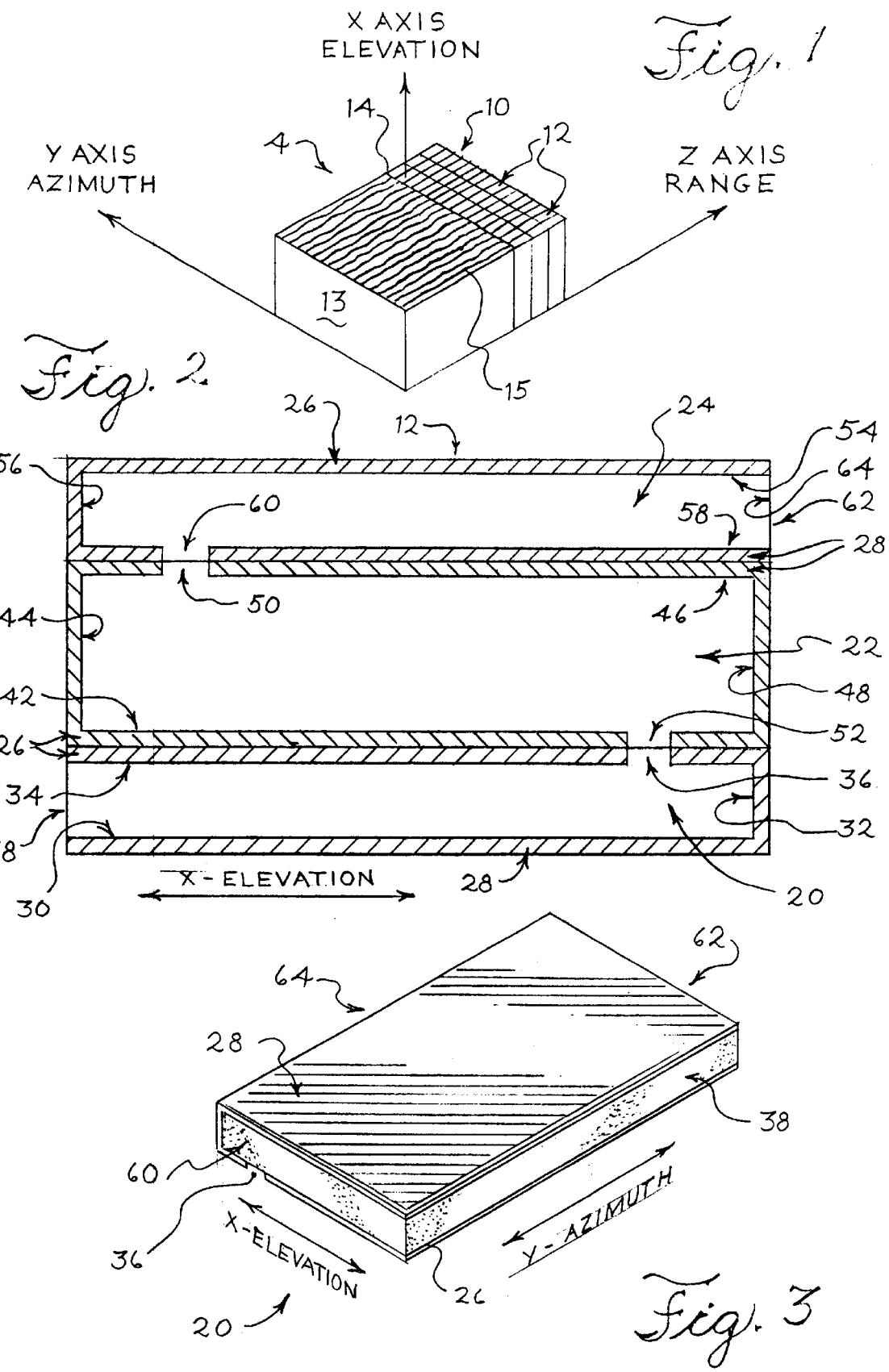

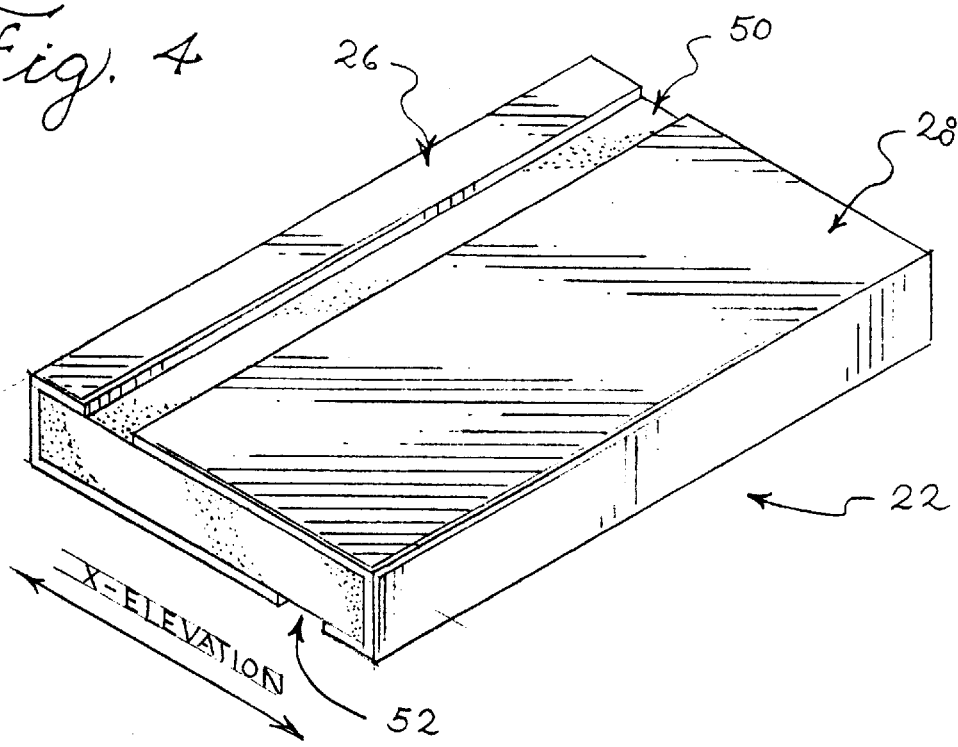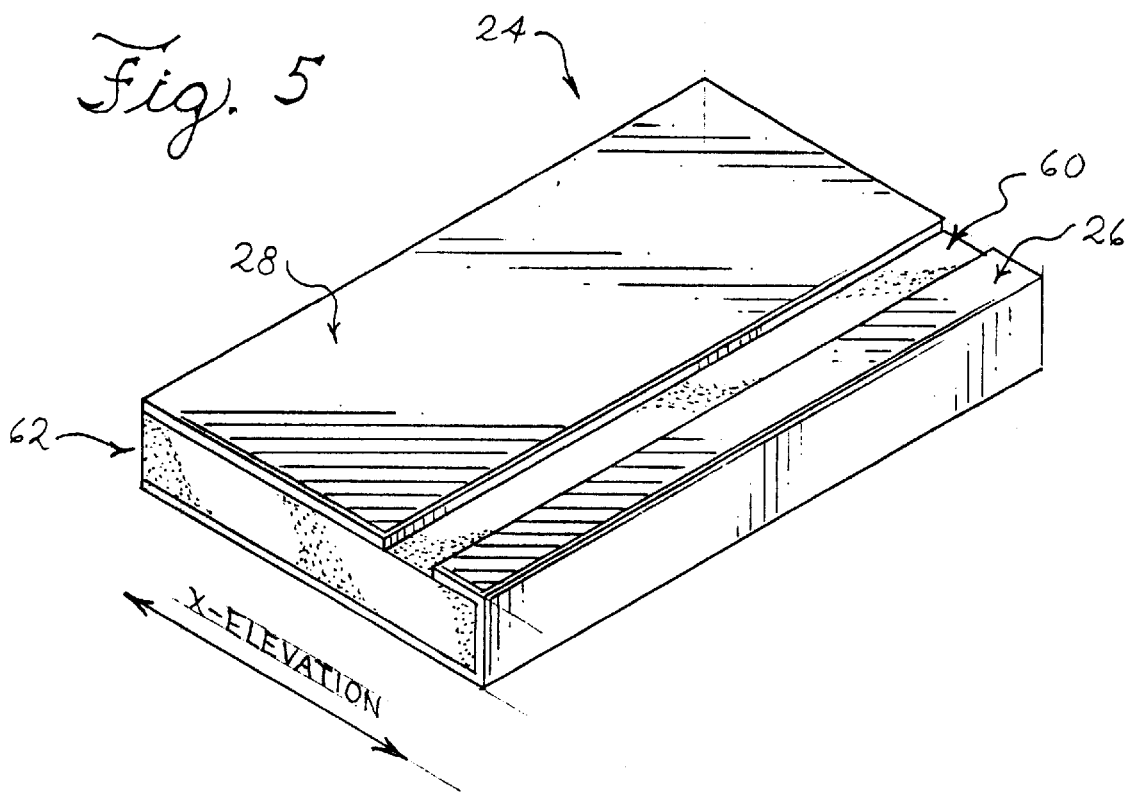

MULTILAYER TRANSDUCER ASSEMBLY AND THE METHOD FOR THE MANUFACTURE THEREOF

FIELD OF THE INVENTION

The present invention is directed to a multilayer transducer assembly and the method for the manufacture thereof, and more particularly, to a multilayer transducer assembly that is simple and cost effective to fabricate.

BACKGROUND OF THE INVENTION

Multilayering of piezoelectric crystals is a well known technique for improving the electrical impedance of a transducer element in comparison to a single layer transducer element having the same thickness as the multilayered transducer element. It has been found that the capacitance of the transducer element increases by $N^2$ where N is the number of layers forming a transducer element. The increased capacitance of the transducer element results in a decrease in electrical impedance of the transducer element by $1/N^2$. This particularly benefits lower frequency arrays as well as transducer elements having small plate areas.

One known method of fabricating a multilayer transducer assembly involves tape casting piezoelectric layers and cofiring electrodes. More particularly, sheets of piezoelectric ceramic are formed from raw materials by tape casting. An internal electrode is formed on a sheet piezoelectric ceramic by screen printing, then another sheet of ceramic is laminated on the internal electrode side of the first sheet. External electrodes are then printed and fired on external sides of the first and second sheets. For example, Saithoh, S. et al., "A Dual Frequency Ultrasonic Probe," *Jpn. J. Appl. Phys.*, vol. 31, suppl. 31-1, pp. 172–4 (1992) describes such a method. Typically connection of the signal electrode formed on the transducer element to leads that will be coupled to an ultrasound system may be made by using a flex circuit or TAB like jumpers or by wirebonding. Connection of the ground electrode formed on the transducer element may be made by using a conductive epoxy that contacts the ground electrode and also makes contact to a secondary connector such as a flex circuit or metal foil.

Several disadvantages exist with fabricating multilayered transducer assemblies by this method. Tape cast piezoelectric material is generally substantially weaker than hot isostatic press piezoelectric material and usually does not survive element definition, i.e., dicing especially fine pitch arrays. Also, because the sheets of piezoelectric ceramic are made from raw materials, in small batches, tape casting does not lend itself to consistency from batch to batch. In addition, tape casting cannot be used to produce sheets having well controlled and/or constant thickness. Moreover, tape casting cannot be used to produce non-planar shapes, such as plano-concave shapes such as that described in U.S. Pat. Nos. 5,415,175 and 5,438,998. Furthermore, the co-fired electrodes are generally thicker, about 4 μm, and have a greater variation in thickness than electrodes deposited by other deposition techniques such as sputter deposition, for example.

Another known method for fabricating multilayered transducer assemblies utilize vias to connect similarly oriented layers. More particularly, multiple holes are punched mechanically or by laser, drilled, or etched into piezoelectric ceramic tape to form the vias on each layer of piezoelectric ceramic. The via holes are filled with a metal paste and the surface electrodes for each layer are deposited by screen printing. Multiple layers of green tape are then superimposed to align the vias to form a multilayer sandwich. The multilayer sandwich is laminated and then finally sintered to form a single package. Metallization is then plated or vacuum deposited on the input pads. For example, U.S. Pat. No. 5,548,564 describes such a method.

Several disadvantages exist with fabricating multilayered transducer assemblies by this method. Forming vias to interconnect similarly oriented layers requires additional steps and thus complicates the fabrication process. In addition, the vias themselves take up valuable real estate in the transducer assembly leaving less real estate for the piezoelectric ceramic. Furthermore, the piezoelectric material may be damaged in the process of creating the vias.

It is thus desirable to provide a multilayer transducer assembly and a method for fabricating the same that allows the use of readily available, high quality piezoelectric material having good mechanical strength. In addition, it is desirable to provide a method for fabricating a multilayered transducer assembly that allows common methods for applying electrodes that provide well controlled and thin electrodes of about 2,000–5,000 Å compared to screen printed and co-fired pastes. Also, it is desirable to provide a method for fabricating multilayered PZT that has precise dimensional control for producing constant thickness, or plano-concave shapes, for example. Furthermore, it is desirable to provide a method for fabricating multilayered transducer assemblies that utilize tools and techniques well known in the ultrasound art.

SUMMARY OF THE INVENTION

According to a first aspect of the present invention there is provided a method of fabricating a multilayered transducer assembly. The method includes the steps of:

(a) creating a first transducer layer from a piezoelectric crystal having a continuous electrode covering all surfaces of the crystal by forming a first discontinuity in the continuous electrode wherein the first discontinuity extends along a top surface of the crystal from a front edge to a back edge of the crystal adjacent to and spaced from a first side surface of the crystal and forming a second discontinuity in the continuous electrode wherein the second discontinuity extends along a second side surface of the crystal;

(b) creating a second transducer layer from a piezoelectric crystal having a continuous electrode covering all surfaces of the crystal by forming a first discontinuity in the continuous electrode wherein the first discontinuity extends along a top surface of the crystal from a front edge to a back edge of the crystal adjacent to and spaced from a first side surface of the crystal and forming a second discontinuity in the continuous electrode wherein the second discontinuity extends along a bottom surface of the crystal from the front edge to the back edge adjacent to and spaced from a second side surface opposite of the first side surface;

(c) creating a third transducer layer according to step (a);

(d) forming a stacked transducer assembly by:

(i) stacking the second transducer layer on the first transducer layer so that the bottom surface of the second transducer layer is in contact with the top surface of the first transducer layer and the second discontinuity on the bottom surface of the second transducer layer is aligned with the first discontinuity on the top surface of the first transducer layer;

(ii) stacking the third transducer layer on the second transducer layer so that the top surface of the third layer is in contact with the top surface of the second layer and the first discontinuity in the top surface of the top layer is aligned with the first discontinuity in the top surface of the second layer;

(e) bonding the stacked transducer assembly together.

According to a second aspect of the present invention there is provided a multilayered transducer assembly including:

a signal flex circuit;

a first piezoelectric layer disposed on the signal flex circuit, the first layer having a positive electrode and a negative electrode and a first discontinuity on a top surface of the first layer separating the positive and negative electrode wherein the positive electrode covers a majority of the top surface of the first layer and a second discontinuity on a bottom surface of the first layer separating the positive and negative electrode wherein the negative electrode covers a majority of the bottom surface of the first layer;

a second piezoelectric layer disposed on the first layer, the second layer having a positive and a negative electrode and a first discontinuity on a top surface of the second layer wherein the negative electrode covers a majority of the top surface of the second layer and a second discontinuity on the bottom surface of the second layer wherein the positive electrode covers a majority of the bottom surface of the second layer;

a third piezoelectric layer disposed on the second layer wherein the third layer has a positive electrode and a negative electrode and a first discontinuity separating the positive electrode from the negative electrode on a top surface of the third layer wherein the positive electrode covers a majority of the top surface of the third layer and a second discontinuity separating the positive electrode from the negative electrode on a bottom surface of the third layer of the third layer wherein the negative electrode covers a majority of the bottom surface of the third layer; wherein the first discontinuity of the first layer abuts and is aligned with the second discontinuity of the second layer and the first discontinuity of the second layer abuts and is aligned with the second discontinuity of the third layer; and a ground flex circuit disposed on the third layer.

According to a third aspect of the invention there is provided a method of fabricating a multilayered transducer assembly. The method includes the steps of:

(a) depositing an electrode on all surfaces of a first layer of piezoelectric ceramic;

(b) depositing an electrode on all surfaces of a second layer of piezoelectric ceramic;

(c) depositing an electrode on all surfaces of a third layer of piezoelectric ceramic;

(d) removing a first portion and a second portion of the electrode on the first layer of piezoelectric ceramic to create a positive and a negative electrode;

(e) removing a first portion and a second portion of the electrode on the second layer of piezoelectric ceramic to create a positive and a negative electrode;

(f) removing a first portion and a second portion of the electrode on the third layer of piezoelectric ceramic to create a positive and a negative electrode;

(g) stacking the second layer on the first layer so that their positive electrodes abut on another;

(h) stacking the third layer on the second layer so that their negative electrodes abut one another;

(i) binding the first, second and third layers together to form a stacked assembly.

According to a fourth aspect of the invention there is provided a method of fabricating a multilayered transducer assembly. The method includes the steps of:

(a) removing a first portion and a second portion of an electrode on a first layer of piezoelectric ceramic wherein the electrode is formed on all surfaces of the first layer to create a positive electrode on a major surface of the first layer and a negative electrode on an opposite major surface of the first layer;

(b) removing a first portion and a second portion of an electrode on a second layer of piezoelectric ceramic wherein the electrode is formed on all surfaces of the second layer to create a positive electrode on a major surface of the second layer and a negative electrode on an opposite major surface of the second layer;

(c) removing a first portion and a second portion of an electrode on a third layer of piezoelectric ceramic wherein the electrode is formed on all surface of the third layer to create a positive electrode on a major surface of the third layer and a negative electrode on an opposite major surface of the third layer;

(d) stacking the second layer on the first layer wherein the positive electrode of the first layer is in contact with the positive electrode of the second layer; and (e) stacking the third layer on the second layer wherein the negative electrode of the second layer is in contact with the negative electrode of the third layer.

BRIEF DESCRIPTION OF THE DRAWINGS

FIG. 1 is a perspective view of a transducer assembly according to a preferred embodiment of the present invention.

FIG. 2 is a cross-sectional view of a multilayered transducer element along the x-elevation axis formed according to a preferred embodiment of the present invention.

FIGS. 3–5 are perspective views of the first, second and third layers of the multilayered transducer element shown in FIG. 2 respectively.

DETAILED DESCRIPTION OF THE PRESENTLY PREFERRED EMBODIMENTS

Figure 6:
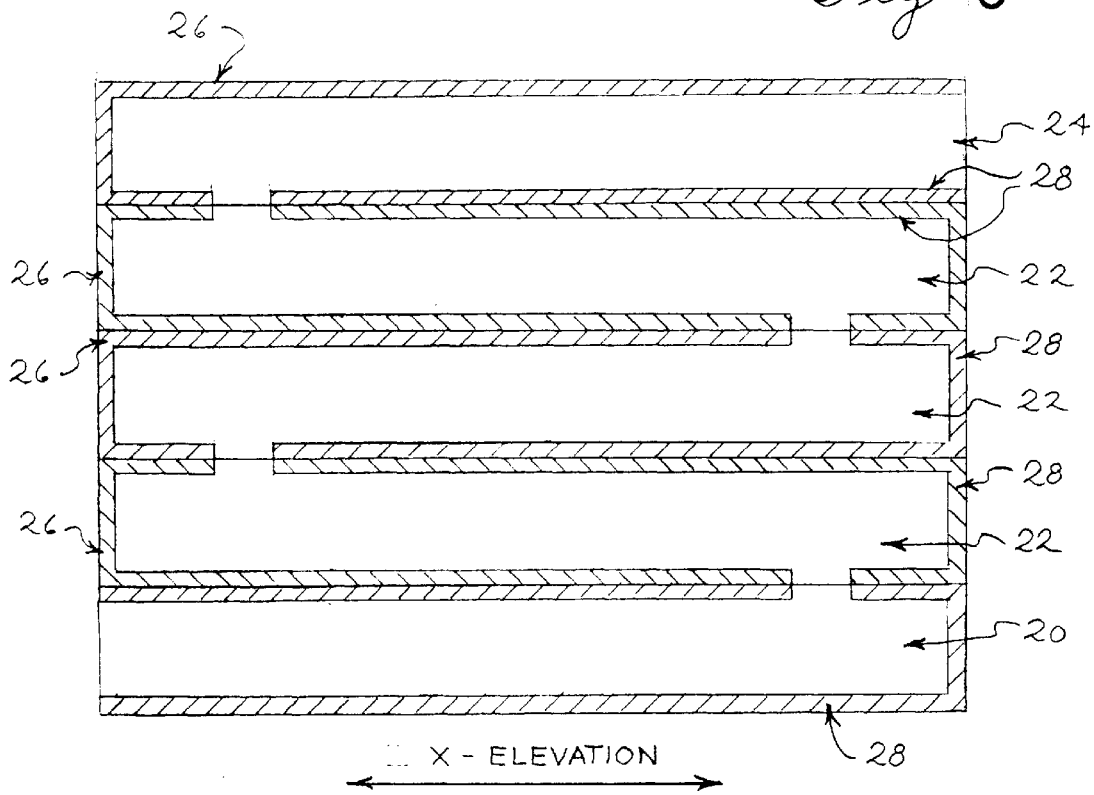
FIG. 6 is a cross-sectional view of a multilayered transducer element along the x-elevational axis formed according to a preferred embodiment of the present invention.

FIG. 1 is a perspective view of a transducer assembly according to a preferred embodiment of the present invention. To simplify and illustrate the relevant features of the assembly not all of the components forming the assembly have been shown. The assembly 4 contains an array 10 of a plurality of transducer elements 12. Adapted from radar terminology, the indicated x, y and z directions are referred to as the azimuth, elevation and range directions or axes, respectively. Typically, there are one hundred twenty eight transducer elements 12 sequentially disposed along the y-azimuth axis. The array 10 may, however, consist of any number of transducer elements 12. The transducer elements 12 are coupled to a signal flex circuit 15 on one side and a ground flex circuit (now shown) on an opposite side. The transducer array 10 is bonded to a top surface of an acoustically attenuating backing block 13 so that the signal flex circuit is preferably sandwiched between the backing block 13 and the transducer elements 12. Kerfs 14 are diced through the ground flex circuit, transducer element, signal flex circuit and partially into the backing block to electrically and acoustically isolate each transducer element 12 from one another as is well known to those of ordinary skill in the art.

FIG. 2 is a cross-sectional view of a multilayered transducer element along the x-elevation axis formed according to a preferred embodiment of the present invention. In this preferred embodiment the multilayered transducer element includes three layers. The transducer element 12 includes a first layer 20 of piezoelectric material, a second layer 22 of piezoelectric material disposed on the first layer 20, and a third layer 24 of piezoelectric material disposed on the second layer 22. Each layer of piezoelectric material includes a positive electrode 26 and a negative electrode 28 formed on the layer. The terms positive and negative electrode simply refer to the transducer array's ultimate connection with an ultrasound system where the positive electrodes will be coupled to signal traces and the negative electrodes will be coupled to ground traces. The first layer of piezoelectric material 20 has its negative electrode 28 covering a bottom surface 30 of the first layer 20, and more preferably covering the entire bottom surface, a first side surface 32 and a portion of the top surface 34, and more preferably covering a minority portion of the top surface 34. Top and bottom, as used to describe the present invention, refer to the orientation of the layers as shown in the Figures. The first layer's 20 positive electrode 26 covers a portion of the top surface 34 and more preferably covers a majority of the top surface 34. A first discontinuity 36 on the top surface 34 of the first layer 20 separates and electrically isolates the positive and negative electrodes 26 and 28. A second discontinuity 38 on a second side surface 40 of the first layer 20 also separates and electrically isolates the positive and negative electrodes 26 and 28. The positive electrode 26 on the second layer 22 covers a portion and more preferably covers a majority of a bottom surface 42 of the second layer 22, a side surface 44 and a portion, preferably a minority portion, of a top surface 46. The negative electrode 28 on the second layer 22 covers a portion and more preferably a majority of the top surface 46, an opposite side surface 48 and a portion, preferably a minority portion, of a bottom surface 42 of the second layer 22. A first discontinuity 50 on the top surface 46 of the second layer 22 and a second discontinuity 52 on the bottom surface 42 of the second layer 22 separate and electrically isolate the positive and negative electrodes 26 and 28. The positive and negative electrodes formed on the third layer 24 are similar to the first layer 20 except that the third layer's positive electrode 26 covers the entire top surface 54 of the third layer, a side surface 56 and a portion of a bottom surface 58 and its negative electrode 28 covers a portion, preferably a majority portion, of the bottom surface 58 of the third layer. A first discontinuity 60 on the bottom surface 58 separates and isolates the positive and negative electrodes and a second discontinuity 62 on a side surface 64 of the third layer also separates and electrically isolates the positive and negative electrodes. The layers are stacked together so that the discontinuities on the top and bottom surfaces of the layers align themselves as shown. It can be seen from the structure of the stacked assembly that the positive electrodes 26 are all electrically coupled together and the negative electrodes 28 are likewise electrically coupled together and that the positive and negative electrodes are electrically isolated from one another.

Thus, each layer has a major positive electrode 26 on one surface and a major negative electrode 28 on an opposite surface.

Next the method of fabricating the multilayered structure shown in FIG. 2 will be described. Three piezoelectric ceramic layers are each metallized on all surfaces of the layer to form a continuous electrode. In a preferred embodiment, the piezoelectric ceramic layers are not formed by tape casting but rather are off-the-shelf components like those commercially available from Motorola of Albuquerque, N. Mex. The dimensions of the layers will depend upon the transducer design. The continuous electrode is deposited on each layer preferably by sputter deposition as is well known to those of ordinary skill. Preferably the electrode is made of gold, but other metals, such as nickel or silver may be used. Preferably the electrode has a thickness measured in the z-range direction of about 1,500–3,000 Å.

FIG. 3 is a perspective view of the first layer 20 of the multilayered stack shown in FIG. 2. Discontinuities 36 and 38 are formed in the electrode to define and electrically isolate the positive and negative electrodes 26 and 28 respectively. The first discontinuity 36 extends from a front edge 60 of the first layer to a rear edge 62 in parallel with a side edge 64 of the layer 20. This discontinuity as well as the other discontinuities may be formed using a dicing saw. Alternatively the discontinuities may be patterned on the layers during electrode deposition. The second discontinuity 38 runs along the entire side surface 38 of the first layer and the front and rear edges 60, 62. FIGS. 4 and 5 are perspective views of the second and third layers of the multilayered stack shown in FIG. 2 respectively. The area of discontinuity on the top and bottom surfaces of the layers are usually placed near a side edge and are wide enough to electrically isolate the positive and negative electrodes. In addition, they are displaced from an edge of the layer by a distance far enough to leave a suitable mating surface of the minority electrode on one layer to make electrical contact with the minority electrode on an adjacent layer. The layers are arranged so that the contacting electrodes of the layers form an interdigitated electrode with alternating polarity as one moves through the stack in the z-range direction.

The layers are stacked as shown in FIG. 2 and are bonded together preferably with an adhesive such as EPO-TEC 301 commercially available from Epoxy Technology of Massachusetts.

FIG. 6 is a cross-sectional view of a multilayered transducer element along the x-elevation axis formed according to a preferred embodiment of the present invention. In this preferred embodiment each transducer element has five layers. The first and fifth layers 20 and 24 respectively are formed the same way as the first and third layers shown in FIGS. 2, 3 and 5 and are thus given the same reference numbers. The middle three layers 22 are formed the same as the second layer shown in FIGS. 2 and 4 and are thus given the same reference number. The middle layers 22 are stacked so that the major positive and negative electrodes 26 and 28 respectively alternate along the z-range axis as shown. Of course it will be appreciated that other odd-numbered multilayered transducer stacks can be formed in the same way.

Figure 7:
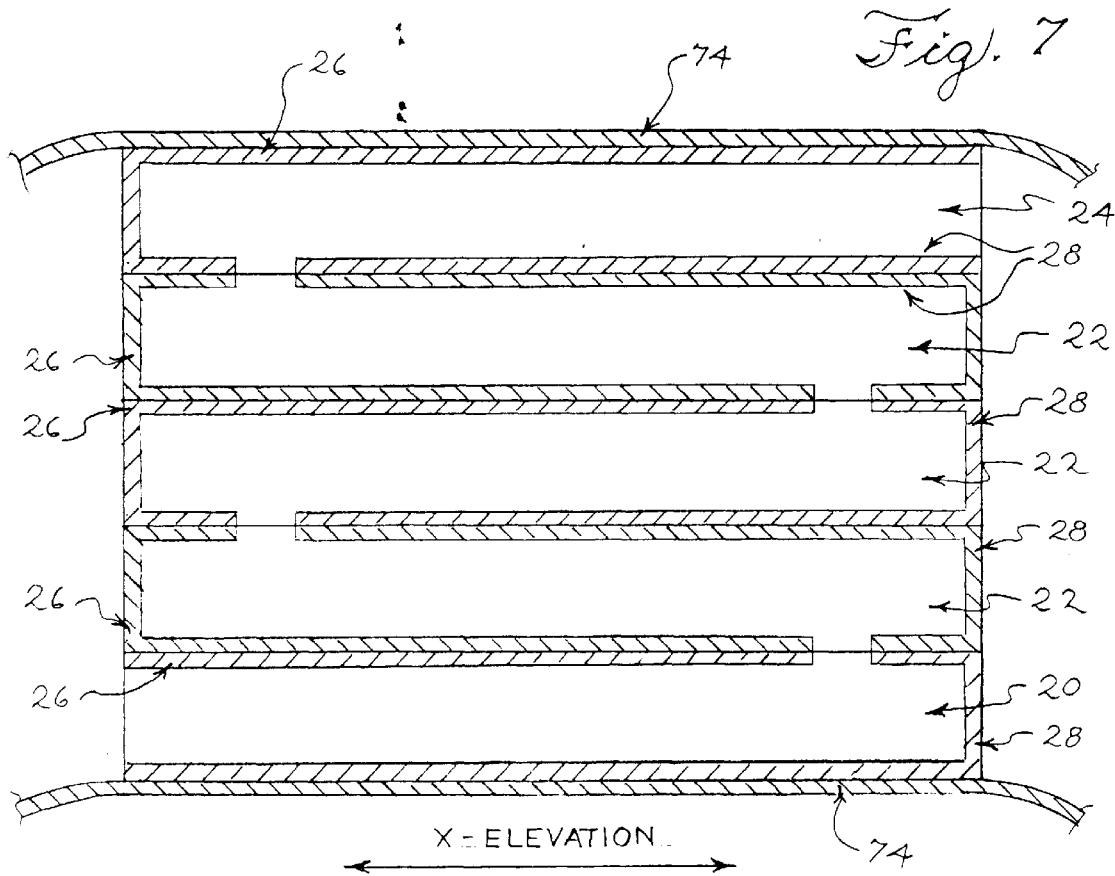
FIG. 7 is a cross-sectional view of the multilayered transducer element shown in FIG. 6 coupled to a signal and ground flex circuit.

FIG. 7 is a cross-sectional view of the multilayered transducer element shown in FIG. 6 coupled to a signal and ground flex circuit 70, 72. In a preferred embodiment the signal and ground flex circuits have a center pad area 74 formed of a thin layer of copper deposited on a polyimide film such as KAPTON™ which is commercially available from the E.I. DuPont Company. Individual traces (not shown) extend from each side of the center pad area 74. In a preferred embodiment the center pad area is coextensive with the electrode formed on the bottom surface of the first layer 20 and the top surface of the fifth layer 24. Sheldahl of Northfield, Minn. manufactures such flex circuits. The flex circuits are bonded to the stacked transducer assembly preferably with an epoxy adhesive. The stacked assembly and flex circuits are then bonded to a top surface of an acoustically attenuated backing block. Next, the transducer elements are defined by dicing kerfs through the ground flex circuit 72, the multilayered stacked transducer assembly, the signal flex circuit 70 and preferably partially into the backing block. The kerfs define each transducer element and electrically and acoustically isolate each transducer element from adjacent transducer elements as is well known to those of ordinary skill in the art.

While the preferred embodiments illustrated used piezoelectric ceramic layers of uniform thickness, the present invention may be used with ceramic layers of non-uniform thickness such as described in U.S. Pat. Nos. 5,438,998 and 5,415,175 both of which are assigned to the present assignee.

In addition, with respect to electrode deposition, the electrodes may be formed by sputter deposition, wet chemical plating, vapor deposition, or any other method that provides suitable adhesion and thickness control. With respect to forming the discontinuous electrode areas these may be formed by using a dicing saw or by patterning the discontinuity during electrode deposition, or any other method suitable for removing sections of the electrode or selectively preventing the formation of an electrode. With respect to joining the piezoelectric layers, the layers may be joined by epoxy bonding or by any other adhesive that provides adequate joint strength and allows point to point contact of the adjacent layer electrodes. With respect to the orientation of the layers, while the preferred embodiments illustrated the stacked assembly beginning with a negative electrode 28 and ending with a positive electrode 26, either a positive or negative starting electrode orientation may be used. The electrodes must simply be arranged so that electrode polarity is alternating for the formed electrodes when moving through the stacked transducer assembly in the z-range axis.

The present invention offers several benefits over the known methods of fabricating multilayered transducer assembly. The method according to the present invention allows use of off-the-shelf, high strength, high quality piezoelectric materials. Previous methods involve forming the piezoelectric materials from raw materials using tape casting techniques. Tape cast materials typically do not have as much strength as hot isostatically pressed materials nor does tape casting lend itself towards consistency from batch to batch. Also, well controlled thickness for planar crystals or well controlled dimensions for non-planar shapes are not possible using tape casting or even using injection molding methods, while the present invention allows for shaping of the crystals using precise techniques, i.e., surface grinding. Also, due to the use of off-the-shelf components, fabricating a multilayered transducer assembly according to the present invention may be more cost effective. In addition, since the electrodes are formed on the individual layers, as opposed to the screen printed/co-fired electrode most often used in existing methods, more precise and robust metallization methods can be used, i.e. sputtering. Sputtering, and most other common deposition techniques afford better control and the ability to apply much thinner metal layers. Also, the metal to crystal interface is generally stronger with electrodes applied via sputtering as compared to co-fired electrodes between green state sheets. Finally, the method according to the present invention utilizes fairly common and readily available tools and techniques (sputtering, bonding and dicing) as opposed to mixing ceramic slurry, tape casting and firing. Nor does the present invention require drilling holes and forming vias to connect similarly oriented crystals.

It is to be understood that the forms of the invention described herewith are to be taken as preferred examples and that various changes in the shape, size and arrangement of parts may be resorted to, without departing from the spirit of the invention or the scope of the claims.

What is claimed is:

1. A multilayered transducer array comprising:
   at least one kerf extending along an elevation axis;
   an array element comprising:
      a signal flex circuit;
      a first piezoelectric layer adhesively bonded to the signal flex circuit, the first layer having a positive electrode and a negative electrode and a first discontinuity on a top surface of the first layer separating the positive and negative electrode wherein the positive electrode covers a majority of the top surface of the first layer and the negative electrode covers a majority of the bottom surface of the first layer;
      a second piezoelectric layer adhesively bonded to the first layer, the second layer having a positive and a negative electrode and a first discontinuity on a top surface of the second layer wherein the negative electrode covers a majority of the top surface of the second layer and a second discontinuity on the bottom surface of the second layer wherein the positive electrode covers a majority of the bottom surface of the second layer;
      a third piezoelectric layer adhesively bonded to the second layer wherein the third layer has a positive electrode and a negative electrode wherein the positive electrode covers a majority of the top surface of the third layer and a second discontinuity separating the positive electrode from the negative electrode on a bottom surface of the third layer wherein the negative electrode covers a majority of the bottom surface of the third layer; wherein the first discontinuity of the first layer abuts and is aligned with the second discontinuity of the second layer and the first discontinuity of the second layer abuts and is aligned with the second discontinuity of the third layer; and
      a ground flex circuit adhesively bonded to the third layer;
   wherein each of said adhesive bonds maintains a point to point contact between said electrodes of said layers.

2. A multilayered transducer according to claim 1 wherein the negative electrode of the first layer covers the entire bottom surface of the first layer and the positive electrode on the top surface of the third layer covers the entire top surface of the third layer.

3. A multilayered transducer according to claim 1 wherein the first, second and third layers each have a uniform thickness.

4. A multilayered transducer according to claim 1 wherein the first, second and third layers each have a non-uniform thickness.

5. The multilayered transducer array of claim 1, wherein said second piezoelectric layer further comprises an odd number of piezoelectric layers, each having a positive and a negative electrode and a first discontinuity on a first surface wherein the negative electrode covers a majority of the first surface and a second discontinuity on an opposite surface wherein the positive electrode covers a majority of the opposite surface and further wherein each of said odd number of piezoelectric layers are adhesively bonded to each other such that said first discontinuity of one said odd number of piezoelectric layers abuts said first discontinuity of another of said odd number of piezoelectric layers and said second discontinuity of one of said odd number of piezoelectric layers abuts said second discontinuity of another of said odd number of piezoelectric layers.

6. The multilayered transducer array of claim 1, wherein said ground flex circuit is adhesively bonded to said first layer and said signal flex circuit is adhesively bonded to said third layer.

* * * * *